United States Patent

[11] 3,594,766

[72] Inventor Barrie Gilbert
Portland, Oreg.
[21] Appl. No 793,651
[22] Filed Jan. 24, 1969
[45] Patented July 20, 1971
[73] Assignee Tektronix, Inc.
Beaverton, Oreg.

[54] ANALOG TO DIGITAL CONVERTER INCLUDING COMPARATOR CIRCUITS WITH INTERNAL LOGIC
12 Claims, 1 Drawing Fig.

[52] U.S. Cl. .......... 340/347 AD
[51] Int. Cl. .......... H03k 13/175
[50] Field of Search .......... 340/347, 169

[56] References Cited
UNITED STATES PATENTS

| | | | |
|---|---|---|---|
| 2,733,432 | 1/1956 | Breckman .......... | 340/347 |
| 3,241,135 | 3/1966 | Kuflik et al. .......... | 340/347 |

*Primary Examiner*—Maynard R. Wilbur
*Assistant Examiner*—Charles D. Miller
*Attorney*—Buckhorn, Blore, Klarquist and Sparkman

ABSTRACT: An analog to digital converter is described having a differential analog input and a plurality of parallel digital outputs which includes a plurality of comparator circuits, each including a pair of emitter coupled transistors having a pair of inputs and a pair of outputs. The inputs formed by the bases of one transistor in each of the comparator circuits are connected in sequence through a voltage divider to one input terminal of the converter and the outputs at the collectors of such one transistors are connected by internal logic in common with the outputs at the collectors of the other transistors in the next preceding comparator circuit so that only when both transistors are nonconducting is an output pulse transmitted to an output terminal of the converter. The converter may have 10 parallel outputs and be used to provide a decimal readout for a 10-position rotary switch by applying a stairstep voltage whose steps correspond to the positions of such switch, as the analog input signal of the converter.

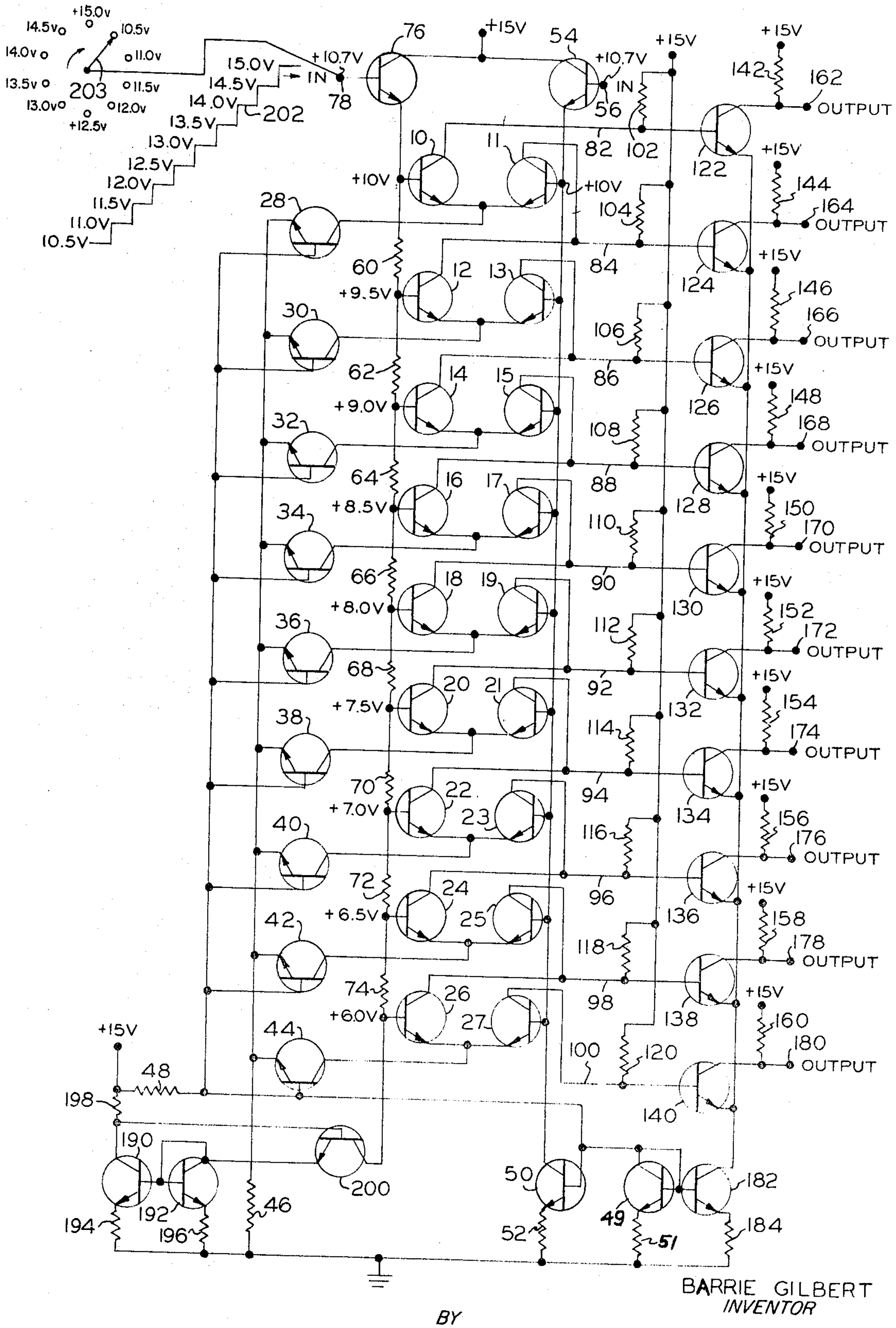
BARRIE GILBERT
*INVENTOR*
BY
*BUCKHORN, BLORE, KLARQUIST & SPARKMAN*
*ATTORNEYS*

ANALOG TO DIGITAL CONVERTER INCLUDING COMPARATOR CIRCUITS WITH INTERNAL LOGIC

BACKGROUND OF INVENTION

The subject matter of the present invention relates generally to analog to digital converters having a differential analog input and a plurality of parallel digital outputs and in particular to such a converter having a plurality of comparator circuits each with a pair of inputs and a pair of first and second outputs. The comparator circuits have internal logic connections by which a first output of one comparator circuit is connected in common with a second output of the next successive comparator circuit to provide an output of the converter. A digital output pulse is produced on an output terminal of the converter when both of the two common outputs of the corresponding comparator circuit are in the same binary conductive condition, which may be an "off" or nonconducting state, such output pulse corresponding to predetermined amplitude range of the analog input signal.

The analog to digital converter of the present invention may have 10 parallel outputs and be used to provide a decimal readout for a 10-position rotary switch. The parallel digital output signals may energize light bulbs in a switch position readout display of the type shown in copending U.S. Pat. application Ser. No. 770,483 of A. R. Bruns et al., filed Oct. 25, 1968. However, the analog to digital converter of the present invention may be used in other conventional apparatus employing such a converter.

The present analog to digital converter may be formed as a monolithic integrated circuit to provide an extremely compact apparatus. In addition, the present converter is much simpler and less expensive than previous converters of this type, since it employs internal logic connections rather than external logic circuits such as "AND" gates, connected to the outputs of comparator circuits to provide the converter with a decimal readout as shown in U.S. Pat. No. 3,221,324 of W. P. Margopoulos, issued Nov. 30, 1965.

It is therefore one object of the present invention to provide an improved analog to digital converter of simple and inexpensive construction.

Another object of the invention is to provide an improved analog to digital converter having a common differential input and a plurality of parallel outputs.

A further object of the present invention is to provide an improved analog to digital converter having a differential input and a plurality of parallel outputs in which a plurality of comparator circuits are employed together with internal logic connections to provide a decimal readout without the use of external gates.

A further object of the present invention is to provide an improved analog to decimal converter circuit which may be used to provide a binary digital readout for a 10-position rotary switch.

An additional object of the present invention is to provide an analog to digital converter composed only of transistors and resistors which may be made as a monolithic semiconductor integrated circuit.

BRIEF DESCRIPTION OF DRAWINGS

Other objects and advantages of the present invention will be apparent from the following detailed description of a preferred embodiment thereof and from the attached drawings of which:

The FIGURE is a schematic diagram of an analog to digital converter made in accordance with the present invention.

DESCRIPTION OF PREFERRED EMBODIMENT

As shown in the FIGURE of the drawing, the analog to digital converter of the present invention includes nine comparator circuits each of which is formed by a pair of transistors, including a first NPN type transistor 10, 12, 14, 16, 18, 20, 22, 24 and 26, and a second NPN type transistor 11, 13, 15, 17, 19, 21, 23, 25 and 27. The first and second transistors of each comparator circuit have their emitters connected together to a common source of DC supply current. Thus nine NPN type current supply transistors 28, 30, 32, 34, 36, 38, 40, 42 and 44 are connected respectively at their collectors to the common emitters of comparator transistor pairs 10–11, 12–13, 14–15, 16–17, 18–19, 20–21, 22–23, 24–25 and 26–27. The emitters of all the current supply transistors 28 to 44 are connected in common to ground through an emitter bias resistor 46 of about 220 ohms, while their bases are all connected in common to a positive DC supply voltage of +15 volts through a coupling resistor 48 of 14 kilohms. A temperature compensation transistor 49 having its collector short circuit connected to its base and its emitter connected to ground through a resistor 51 of 200 ohms, is also connected at its base to resistor 48 for reasons hereafter described. As a result of this biasing, all of the emitter supply transistors 28 to 44 are quiescently conducting and supply emitter currents of approximately 0.1 milliampere. The second comparator transistors 11, 13, 15, 17, 19, 21, 23, 25 and 27 are normally biased conducting, while the first comparator transistors 10, 12, 14, 16, 18, 20, 22, 24 and 26 are normally biased nonconducting. As a result all of the emitter supply current flows through the second comparator transistors when no analog signal is applied to the converter. However, equal amounts of emitter current flow through transistors 10 and 11 since they are actually biased in a transition state.

All of the second comparator transistors 11, 13, 15, 17, 19, 21, 23, 25 and 27 have their bases connected to the collector of a transistor 50 of NPN type, whose emitter is grounded through a bias resistor 52 of about 200 ohms. The base of transistor 50 is connected to the DC bias voltage at the common terminal of the base of transistor 49 and the resistor 48 so that transistor 50 provides a substantially constant collector current of 1 milliampere. The collector of transistor 50 is connected to the emitter of an input transistor 54 of NPN type whose collector is connected to a source of positive DC supply voltage of +15 volts. The base of input transistor 54 is connected to one input terminal 56 of the analog to digital converter. A source of positive DC supply voltage of +10.7 volts may be applied to the input terminal 56 to bias the input transistor 54 quiescently conducting. As a result of the emitter to collector current flowing through input transistor 54 and transistor 50, and the 0.7 volt drop across the emitter junction of such input transistor a DC voltage of +10.0 volts is applied to all the bases of the second comparator transistors 11, 13, 15, 17, 19, 21, 23, 25 and 27.

The bases of the first comparator transistors 10, 12, 14, 16, 18, 20, 22, 24 and 26 are each connected to a different tap on a voltage divider formed by eight series connected bias resistors 60, 62, 64, 66, 68, 70, 72 and 74 of 500 ohms each. The common connection of the lower terminal of resistor 74 and the base of the first comparator transistor 26 is connected to the output of a constant current source hereafter described which supplies a DC bias current of 1 milliampere through the voltage divider. As a result, a voltage drop of 0.5 volt is produced across each bias resistor of the voltage divider so that each successive first comparator transistor is provided with a base bias voltage of approximately 0.5 volt less than that of the comparator transistor immediately above it. The base of the first comparator transistor 10 of the uppermost comparator circuit and the upper terminal of bias resistor 60 are connected in common to the emitter of another input transistor 76 of NPN type. The collector of input transistor 76 is connected to source of positive DC supply voltage of +15 volts, and its base is connected to another input terminal 78 of the analog to digital converter. A source of DC bias voltage of +10.7 volts is applied to input terminal 78 to render input transistor 76 quiescently conducting and provide a bias voltage of +10.0 volts on the upper end of the voltage divider. As a result of the voltage drop across the voltage divider resistors 60 to 74, the bases of the first comparator transistors 10, 12, 14, 16, 18, 20, 22, 24 and 26 are respectively provided with positive DC bias voltages of 10, 9.5, 9.0, 8.5, 8.0, 7.5, 7.0, 6.5 and 6.0 volts. Since all of these voltages except that on the base of transistor 10 is less than the 10 volts applied to the bases of the second comparator transistors, all the other fist comparator transistors are quiescently biased nonconducting while the second comparator transistors are normally biased conducting. It should be noted that since transistors 10 and 11 of the first comparator circuit are both provided with the same base bias voltage of +10 volts, they are in a state of transition so that transistor 10 can be considered conducting and is rendered nonconducting by the +9.8 volts produced on its base when an input signal of +10.5 voltage is applied to input terminal 78. This causes an output pulse to be transmitted on a first output conductor 82 connected to the collector of comparator transistor 10.

The comparator circuits are provided with internal logic connections connecting the collector of the second comparator transistor of a preceding comparator circuit with the collector of the first comparator transistor of the next successive comparator circuit, so that both of such transistors must be in an "off" or nonconducting condition before an output pulse is produced on the output conductor connected to such collectors. Thus the collectors of each of the eight pairs of comparator transistors 11–12, 13–14, 15–16, 17–18, 19–20, 21–22, 23–24, and 25–26 are connected together to form eight more outputs which are connected to output conductors 84, 86, 88, 90, 92, 94, 96 and 98, respectively, providing the second, third, fourth, fifth, sixth, seventh, eighth and ninth outputs of the converter. A tenth output conductor 100 is connected to the collector of comparator transistor 27. As a result of the 10 parallel outputs 82 through 100 the converter produces a decimal readout for a common analog input signal applied between the differential input terminals 56 and 78. Each of the 10 output conductors 82 through 100 is connected through a load resistor 102, 104, 106, 108, 110, 112, 114, 116, 118 and 120, respectively, of about 6 kilohms to a source of positive DC supply voltage of +15 volts. Thus when both of the comparator transistors connected to an output conductor are rendered nonconducting, a positive going voltage pulse is produced on such output conductor corresponding to a sudden reduction to zero of the current flowing in the load resistor.

Since a zero current output pulse is often not as useful as an output pulse in the form of sudden increase or presence of current, in some cases it may be desirable to provide ten NPN type inverter transistors 112, 124, 126, 128, 130, 132, 134, 136, 138 and 140 having their bases respectively connected to the 10 output conductors 82, 84, 86, 88, 90, 92, 94, 96, 98 and 100. The emitters of all the inverter transistors 122 to 140 are connected in common to a source of substantially constant current of about 130 microamperes hereafter described, and the collectors of the inverter transistors are each connected to a source of positive DC supply voltage of +15 volts through a load resistor 142, 144, 146, 148, 150, 152, 154, 156, 158 and 160, respectively. The inverter transistors are normally biased nonconducting and are rendered conducting when a positive voltage output pulse is produced on one of the output conductors 82 to 100. This positive going output pulse is inverted and transmitted from the collector of the inverter transistor as a negative going voltage pulse produced by the sudden flow of current in the load resistor associated with such inverter transistor when it is switched into conduction. The collectors of the inverter transistors 122, 124, 126, 128, 130, 132, 134, 136, 138 and 140 are connected respectively to ten output terminals 162, 164, 166, 168, 170, 172, 174, 176, 178 and 180 which provide 10 parallel decimal coded binary output signals.

The constant current source connected to the emitters of the inverter transistors includes a current supply transistor 182 having its emitter connected to ground through a resistor 184 of about 1.5 kilohms, its collector connected to the common emitters of the inverter transistors and its base connected to a DC bias voltage at the common terminal of the base of transistor 49 and resistor 48. As a result transistor 182 has a constant emitter current and supplies a substantially constant collector current of 130 microamperes to the common emitters of the inverter transistors.

The temperature compensation transistor 49 acts as a PN junction diode whose resistance change due to temperature variation matches those of the emitter junctions of transistors 28 to 44, 50 and 182 connected in parallel with such diode so that it maintains their emitter currents constant. Thus any decrease in emitter junction resistance tending to increase the emitter current in the transistors is compensated for by the resulting decrease in base bias voltage applied thereto by diode connected transistor 49. The emitter junction resistance of transistor 49 "tracks" that of the other transistors because they are all part of a monolithic integrated circuit and therefore have matched characteristics.

Another more precise constant current source is employed to maintain a constant bias current of 1 milliampere flowing through the voltage divider resistors 60 to 74. This current source includes a current supply transistor 190, a temperature compensation transistor 192, whose emitters are each connected to ground through resistors 194 and 196, respectively, of 400 ohms each. The collector of transistor 190 is connected to the source of positive DC supply voltage of +15 volts through a load resistor 198 of 13.3 kilohms. The collector junction of transistor 192 is short circuited and its base is connected to the base of transistor 190 so that the emitter currents of such transistors are the same since they are matched NPN transistors. Transistor 192 maintains the emitter current of transistor 190 more constant by providing temperature compensation for any changes in resistance of the emitter junction of transistor 190 and as a result causes its collector current to remain fairly constant. Another NPN type current supply transistor 200 is provided with its base connected to the collector of transistor 190 and its emitter connected to ground through the emitter junction of transistor 192 to reduce any variations in the collector current of transistor due to its beta current gain. As a result the collector current of transistor 200 is maintained more constant to provide the current source with a constant current of 1 milliampere, which is supplied to the bottom end of the voltage divider at the common terminal of resistor 74 and the base of comparator transistor 26. A more detailed discussion of this current source may be found in copending U.S. Pat. application Ser. No. 704,106 of G. R. Wilson filed Feb. 8, 1968. Of course other sources of constant current may be employed but those described above are especially adaptable for use with monolithic integrated circuits.

When the analog to digital converter of the present invention is employed as a decimal readout for a 10-position rotary switch 203, a stairstep analog signal 202 may be applied to differential input terminal 78 by such switch. This stairstep signal is provided with ten 0.5 volt steps corresponding to the switch positions which begins with a first step of +10.5 volts and ends with a tenth step of +15.0 volts. The +10.5 volt step applies a voltage of +9.8 volts to the base of comparator transistor 10 rendering it nonconducting to produce a zero current in output conductor 82 and a current output pulse on the first output terminal 162. The second step of +11.0 volts applies a voltage of +10.3 volts to the base of transistor 10 rendering it conducting and transistor 11 nonconducting. Since both transistors 11 and 12 are then nonconducting, a zero current is produced on output conductor 84 and a current output pulse on the second output terminal 164. The third stairstep pulse of +11.5 volts renders comparator transistors 10 and 12 conducting and comparator transistors 11 and 13 nonconducting. Since both transistors 13 and 14 are then nonconducting, an output pulse is produced on output conductor 86 and third output terminal 166. A similar operation is repeated for all of the remaining stairsteps of analog signal 202 to provide 10 digital output pulses on the 10 different output terminals corresponding to 10 different voltage levels of the analog signal.

It will be obvious to those having ordinary skill in the art that many changes may be made in the details of the above-described preferred embodiment of the present invention without departing from the spirit of the invention. For example, if the circuit is not made as a monolithic integrated circuit, NPN and PNP type transistors can be used or vacuum tubes may be employed in place of the transistors. Therefore the scope of the invention should only be determined by the following claims.

I claim:

1. An analog to digital converter circuit, comprising:

comparator means including a plurality of signal comparator circuits each having a pair of first and second inputs and a pair of first and second outputs, said comparator circuits being switching circuits connected so that one of said outputs is rendered conducting and the other output is rendered nonconducting when he comparator circuit switches;

first bias means for applying substantially the same DC bias voltage to the first inputs of said comparator circuits, said first inputs of said comparator circuits all being connected in common to one input terminal of the converter circuit;

second bias means for applying a plurality of different DC bias voltages to the second inputs of said comparator circuits, said second inputs being connected in a sequence to another input terminal of the converter circuit so that their bias voltages successively increase; and internal logic means within the comparator means, for directly connecting the first outputs of the comparator circuits in common with the second outputs of successive comparator circuits in said sequence to provide a plurality of common outputs for the comparator means, and for producing an output pulse on one of the common outputs when the first output of one comparator circuit and the second output of another comparator circuit connected in common with said one common output are both of the same condition.

2. A converter circuit in accordance with claim 1 which also includes an input means for applying a differential analog input signal between the inputs of each comparator circuit so that when the voltage of the differential input signal exceeds the bias voltage applied by the second bias means to the second input of a comparator circuit the outputs thereof switch between conduction and nonconduction to produce a digital output pulse on one of the output terminals of said converter.

3. A converter circuit in accordance with claim 1 in which the second bias means includes a voltage divider having a plurality of taps for applying said different bias voltages with the voltage differences between adjacent taps being substantially the same values.

4. A converter circuit in accordance with claim 1 in which the comparator circuits each include a pair of first and second electronic switching devices respectively having their control electrodes connected as the first and second inputs, having their output electrodes connected as the first and second outputs of the comparator circuits, and having their common electrodes connected together so that when one of said pair of switching devices is conducting the other is nonconducting.

5. A converter circuit in accordance with claim 4 in which the first and second bias means apply substantially the same DC bias current to the control electrodes of all of the switching devices in the comparator circuits.

6. A converter circuit in accordance with claim 4 in which the switching devices are semiconductor switching devices.

7. A converter circuit in accordance with claim 5 in which the switch devices are transistors having their bases connected as the control electrodes, having their collectors connected as the output electrodes, and having their emitters connected as the common electrodes.

8. A converter circuit in accordance with claim 7 in which the input means includes a pair of input transistors connected as emitter follower amplifiers having their bases connected as inputs of the converter circuit with the emitter of one input transistor connected to one end of the voltage divider for applying input signals to the second inputs of the comparator circuits and with the emitter of the other input transistor connected to the first inputs of each comparator circuit.

9. A converter circuit in accordance with claim 1 in which the input means includes a source of input voltage signals which differ in voltage amplitude by an amount equal to said voltage difference.

10. A converter circuit in accordance with claim 9 in which the source of input voltages is controlled by a mechanical switch so that the input voltage signals represent the position of such switch by changes in their voltage amplitude, and the digital output signal are transmitted to a switch position readout means.

11. A converter circuit in accordance with claim 6 in which the semiconductor switching devices are provided as part of comparator circuits formed in a monolithic integrated circuit.

12. A converter circuit in accordance with claim 7 which also includes a plurality of output transistors each connected as an inverter amplifier with its base connected to one output of the comparator means, and a common source of DC supply current connected to the emitters of all of the output transistors.

PO-1050
(5/69)

UNITED STATES PATENT OFFICE
CERTIFICATE OF CORRECTION

Patent No. 3,594,766 Dated July 20, 1971

Inventor(s) Barrie Gilbert

It is certified that error appears in the above-identified patent and that said Letters Patent are hereby corrected as shown below:

In the specification:

Column 3, line 49, "112" should be --122--.

In the claims:

In accordance with the Rule 312 Amendment entered by the Official Letter dated March 15, 1971, please insert the following:

Column 5, claim 1, after line 29, should be inserted --differential input means for applying an input signal between said one input terminal and said another input terminal both of which are ungrounded--;

Column 5, claim 2, line 1, delete "which also includes an" and insert after "claim 1" --in which the differential--; and on line 2, delete "for applying" and after "means" insert --applies;

Column 6, claim 3, line 3, after "values" insert --and a constant current source for supplying bias current through said voltage divider.--

Signed and sealed this 29th day of February 1972.

(SEAL)
Attest:

EDWARD M.FLETCHER,JR.
Attesting Officer

ROBERT GOTTSCHALK
Commissioner of Patents